March 4, 1969 T. R. HUFFMAN 3,431,468

BURIED INTEGRATED CIRCUIT RADIATION SHIELDS

Filed April 17, 1967

INVENTOR.
Tommie R. Huffman

BY

Mueller, Aichele & Rauner

ATTY'S.

United States Patent Office 3,431,468

Patented Mar. 4, 1969

3,431,468

BURIED INTEGRATED CIRCUIT RADIATION SHIELDS

Tommie R. Huffman, Tempe, Ariz., assignor to Motorola, Inc., Franklin Park, Ill., a corporation of Illinois Filed Apr. 17, 1967, Ser. No. 631,427

U.S. Cl. 317—101 2 Claims

Int. Cl. H02b *1/04*

ABSTRACT OF THE DISCLOSURE

An integrated circuit having insulated regions with metallic buried layers for shielding such regions from one another. Also, a metallic layer is disposed between the electrical insulation layer and the substrate with a collector metallic buried layer electrode formed inside the buried insulation layer. The various buried metallic layers in the insulated regions can be used to interconnect various devices of the integrated circuit structure.

BACKGROUND OF THE INVENTION

This invention relates to silicon integrated circuit structures and to those structures resistant to electromagnetic radiation and of high power capability.

In utilizing large scale integrated circuits, that is, those integrated circuits wherein there are a multiplicity of devices formed on one integrated circuit chip or wafer, there is a possibility that there is undesired electrical interaction between adjacent integrated devices. Such devices are normally formed either in an insulated or an isolated semiconductor region within the semiconductor wafer. Those devices formed in insulated regions, such as oscillators, may radiate energy to cause interference with adjacent linear circuits, such as sensitive high gain amplifier. Also, the integrated circuit wafer may be operated in an environment subject to electromagnetic radiation. It is desirable for high reliability that such radiation be isolated or kept from interfering with such electrical circuits. It is also desirable that the same structure or element of a structure be utilized for several different purposes for reducing costs and enhancing operations.

SUMMARY OF THE INVENTION

It is an object of this invention to provide an improved integrated circuit structure.

It is another object of this invention to provide an integrated circuit structure having a buried metallic layer which operates as an electromagnetic shield and may serve as a heat sink.

It is a further object of this invention to provide in an integrated circuit structure a buried metallic layer which provides electromagnetic shielding, heat sink properties, and is used as a device interconnection conductor.

A device incorporating the teachings of the present invention features a semiconductor substrate with a plurality of semiconductor regions formed therein from a major surface. Each region is electrically insulated from the substrate by a buried insulating layer, usually deposited therein, and extending to a major surface of the substrate wherein it continues over the surface of the substrate. A buried metallic layer is disposed contiguously with the insulating layer and extends to the major surface. Electrical connections are made to the metallic layer. When the buried metallic layer is inside the insulating layer, i.e., intermediate the buried insulating layer and the region, it may form the collector contact of a transistor device. When molybdenum disilicide is used, for example, it may also be utilized as a heat sink for the transistor or semiconductor device to increase power handling capabilities. Alternatively, the buried metallic layer may be disposed intermediate the insulating layer and the semiconductor substrate. Such buried metallic layer may extend over the surface for forming a ground plane for multilayered circuits above the substrate surface.

When the buried metallic layer is formed inside the insulating layer, i.e., adjacent the semiconductor device, it acts as to shield radiation from external sources. When the buried metallic layer is formed outside the buried insulating layer, i.e., intermediate substrate and the buried insulating layer, it serves to shield outgoing radiation, i.e., any radiation generated by the device. In an integrated circuit structure wherein all devices have a buried metallic layer inside the buried insulating layer no outer buried metallic layer is required.

THE DRAWING

DESCRIPTION OF THE ILLUSTRATIVE EMBODIMENTS

Figure 1:
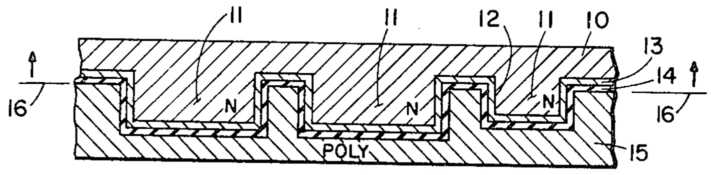
FIG. 1 is an enlarged cross-sectional view illustrating the first stages of preparation of the device incorporating teachings of this invention.
Figure 3:
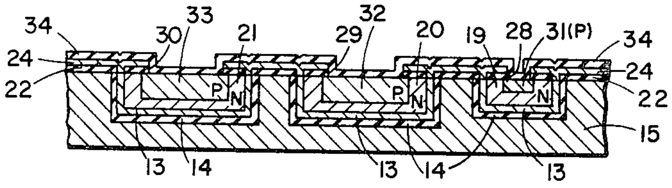
Figure 4:
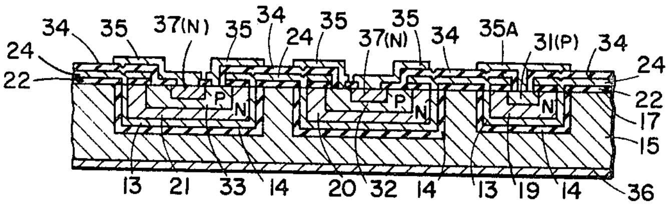
FIG. 4 is an enlarged cross-sectional view of a completed integrated circuit structure fabricated as described with respect to FIGS. 1–3 incorporating teachings of the present invention.
Figure 5:
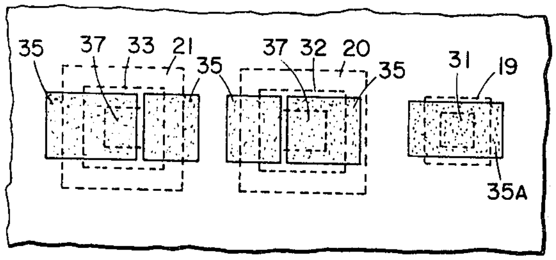
FIG. 5 is a schematic plan view of the FIG. 4 completed structure.

The fabrication of the completed device shown in FIGS. 4 and 5 is explained with reference to FIGS. 1, 2, and 3. A single crystal silicon wafer 10 is obtained and formed with a castellated surface 12. Portions 11 of the castellations will form the insulated semicondutcor regions later referred to. A thin metallic layer 13 is vapor deposited over the castellated surface; portions of such layer will become buried metallic layers. Over metallic layer 13 a silicon dioxide layer 14 is vapor deposited at a lower temperature such that layer 13 will be electrically isolated from polycrystalline wafer 15. Portions of layer 14 will become the insulating buried layers of FIG. 4. After oxide layer 14 is deposited, a polycrystalline silicon substrate 15 is vapor grown thereover. Polycrystalline silicon substrate 15 forms the carrier substrate for integrated circuit structure of FIG. 4.

The next step includes the removal of silicon crystal wafer 10 and layers 13 and 14 above line 16—16 (FIG. 1) resulting in a wafer having a substrate 15 and a smooth upper surface 17 extending across the entire wafer including single crystal silicon regions 19, 20, and 21 which are the only remaining portions of single crystal wafer 10. After smooth surface 17 has been formed, lapping and polishing, a silicon dioxide layer 22 is thermally grown thereon. Thermally grown oxide layer 22 grows wherever single and polycrystalline silicon are exposed on surface 17. Where buried metallic layer 13 or buried insulating layer 14 extends to major surface 17 no thermal oxide will grow. However, in the process layer 22 will extend somewhat over the ends 23 of buried oxide layer 13 such that a continuous silicon dioxide insulating layer is formed across the castellated upper portion of substrate 15 which includes layer 22 on surface 17 and buried oxide layers 14 as connected together at the butt ends 23 thereof. Therefore, substrate 15 is completely electrically insulated from regions 19, 20, and 21 and anything thereabove including buried metallic layer 13.

Figure 2:
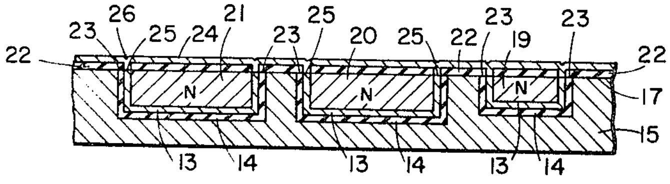
FIGS. 2 and 3 are enlarged cross-sectional views of the semiconductor device subsequent to the FIG. 1 step and showing various stages of fabrication of one form of buried metallic layers.

A metallic layer 24 is then vapor deposited over oxide layer 22 and to the surface ends 25 of metallic buried layer 13, as shown in FIG. 2. Because of the recess at ends 25 of layer 13 buried portions, small dips 26 are formed immediately thereover. With suitable optical magnification, such small dips may be used to identify the location of regions 19, 20, and 21 by visual inspection.

Next, apertures 28, 29, and 30 (FIG. 3) are etched through layers 22 and 24 to expose portions of surface 17 respectively over insulated regions or islands 19, 20, and 21. Next, a doping impurity is diffused through the apertures 28, 29, and 30 to form regions 31, 32, and 33 having an opposite conductivity type than the original regions 19, 20, and 21. Any known diffusion process may be used. During the usual diffusion cycle of forming the last referred to regions, an oxide layer 34 is formed over the entire surface as shown and serves to cover surface 17 inside apertures 28, 29, and 30 where it was exposed. If diffusions were performed in a non-oxidizing atmosphere, layer 34 is not formed.

Referring next to FIG. 4, electrical contacts 35 have been added to the FIG. 3 structure and connected to various semiconductor regions as shown and in a known manner. In addition, ground plane 36 was added to the reverse side of polycrystalline silicon carrier 15 and emitters 37 were diffused into regions 20 and 21. As shown in FIG. 4, the portions of layer 24 left on the device after the above described operations, together with the buried portions of metallic layer 13, are shown as forming a continuous conductive path across the device. It should be noted that such conductive path provides connections to the collectors of both transistors formed in the insulated regions 20 and 21 as well as to one side of a semiconductor diode formed in insulated region 19. The other semiconductor region 31 of semiconductor diode 19 is connected through contact 35A to a circuit (not shown). In this manner the buried portions of metallic layer 13 are used to interconnect various devices on an integrated circuit structure and, in addition, provides shielding from electromagnetic radiation that would tend to enter insulated regions 19, 20, and 21. It should be noted that metallic layer 24 extends over the junctions formed, for example, in regions 21 and 33. This layer forms a charge neutralizing layer for preventing channel formation along surface 17 for increasing surface reverse breakdown voltage. Such transistors include emitters 37 formed in a usual manner. It should be noted that oxide layer 22 passivates certain of the junctions formed between adjacent semiconductor regions of the respective devices while the thermal oxide layer 34 passivates the emitter-base junction of transistors in region 20 and 21.

When metallic layer 13 is formed from molybdenum disilicide ($MoSi_2$) which has favorable thermal characteristics, the metallic layer 24, also of molybdenum disilicide, may be connected to a large copper body (not shown) to act as a heat sink and thereby increase the power handling capabilities of transistor devices in insulated regions 20 and 21, as well as the diode in insulated region 19. This alloy of $MoSi_2$ is compatible with silicon dioxide and with silicon.

Silicon carbide (SiC) may be used for layer 13. In addition to the above described metallic layer 13 constituents, tantalium, tungsten, and manganese, and alloys thereof, may be used. In so using the last three mentioned materials, such formed metallic layers have to be protected from oxidation during diffusions. Also, sapphire and chromium or alloys thereof may be substituted for the aforementioned molybdenum disilicide. It should be noted that molybdenum disilicide, sapphire, and chromium need not be masked by $SiO_2$ during a diffusion process as they withstand high temperature diffusions.

Figure 6:
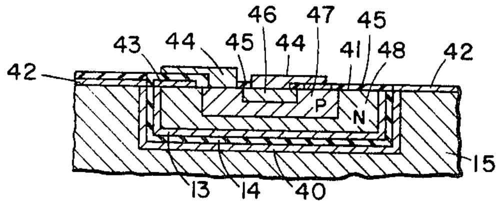
FIG. 6 is an enlarged cross-sectional view of one semiconductor region incorporating both inner and outer buried metallic layers for an insulated semiconductor region.

Referring next to FIG. 6, a second embodiment of the present invention is illustrated with respect to a single region, it being understood that a plurality of such regions may be formed within an integrated circuit structure. Also, the formation of the insulated region is made in the same manner as described with respect to FIGS. 1, 2, and 3 for regions 19, 20, and 21. A polycrystalline silicon carrier 15 is used to support the semiconductor structure. Before forming the polycrystalline silicon over the castellated surface of wafer 10 (FIG. 1) wherein the single crystal wafer 10 has layers 13 and 14 already deposited thereon, an outer buried metallic layer 40 is then deposited thereover as shown, before substrate 15 is grown. When the single crystal wafer portion is removed, such as indicated by line 16 (FIG. 1), a surface 41 is formed on carrier 15 (FIG. 6 only). Metallic layer 42 may be vapor deposited over the portion of surface 41 to form a ground plane adjacent the substrate 15 for forming high frequency transmission lines with multilayered conductors (not shown) to be formed on top of surface 41. Alternatively, a thermal oxide layer (not shown) may be grown on surface 41 before depositing layer 42. In FIG. 6, metallic layer 43 is formed in electrical connection relation to inner buried metallic layer 13 for forming a collector contact which may be connected to other devices (not shown) in the integrated circuit in the same manner as shown in FIG. 3. Other contacts 44 and insulating and passivating oxide layer 45 are formed on surface 41 in the usual manner. Emitter, base, and collector regions 46, 47, and 48 are formed inside metallic layer 13 as aforedescribed.

Outer buried metallic layer 40 intermediate buried insulating layer 14 and substrate 15 may be used as a ground plane as described or be connected to another reference potential. Alternatively, it may be left "floating" electrically except for the conductivity of substrate 15. However, layer 40 may have an additional $SiO_2$ layer separating it from substrate 15. Buried metallic layer 40 may be formed of the same material as buried metallic layer 13.

When the transistor 46, 47, 48 is used in an oscillator circuit, buried metallic layer 13 has a potential equal to the collector potential which rapidly changes. As such, it emits electro-magnetic radiation. Outer buried metallic layer 40, connected to a ground reference potential, intercepts such emitted radiation returning such energy to the power supply through a suitable connection (not shown). In using the FIG. 6 configuration, only one island need be shielded against radiation when both layers 13 and 40 are used. Both incoming and outgoing radiation will be intercepted and supplied to a reference potential source to provide an effective radiation shield.

I claim:

1. An integrated circuit device having a semiconductive substrate with a plurality of semiconductive regions extending therein from a major surface, the semiconductive regions being formed of monocrystalline semiconductive materials in which devices are formed, the improvement including in combination, an oxide coating (22) on said major surface (17) extending thereover except at selected areas over the various regions (19, 20, 21), a metallic layer (13) extending in contiguous relationship with each of said semiconductor regions inwardly into said substrate from said major surface and completely covering said regions under said major surface, said metallic layer having a portion (24) extending over said oxide layer over the respective regions and over said oxide layer between adjacent semiconductive regions (20, 21), a second oxide layer (34) covering said second portion, a metal layer (35) in ohmic contact with one of said semiconductive regions and extending upwardly and over said second oxide layer, and said first-mentioned metal layer portion (24) having a miniscule depression (26) contiguous with the inner section of said semiconductor regions with said major surface.

2. The combination of claim 1 further including a second metallic layer (40) disposed intermediate said insulating layer (14) and said substrate (15) and continuously interposed between said first mentioned oxide layer (24) and said major surface for forming a ground plane extending entirely across said major surface and extending intermediate each of said semiconductor regions and said substrate.

References Cited

UNITED STATES PATENTS 3,381,182 4/1968 Thornton ------------ 317—234

LEWIS H. MYERS, *Primary Examiner.*

J. R. SCOTT, *Assistant Examiner.*

U.S. Cl. X.R.

317—234